United States Patent
Maamari et al.

(10) Patent No.: US 9,979,262 B2
(45) Date of Patent: May 22, 2018

(54) POSITIONING DEVICE IN GANTRY TYPE OF CONSTRUCTION HAVING A POSITION-MEASUREMENT DEVICE FOR MEASURING THE POSITION OF A CARRIAGE RELATIVE TO A CROSS-MEMBER

(71) Applicant: ETEL S.A., Môtiers (CH)

(72) Inventors: Nadim Maamari, Neuchâtel (CH); Ralph Coleman, Fleurier (CH)

(73) Assignee: ETEL S.A., Môtiers (CH)

( * ) Notice: Subject to any disclaimer, the term of this patent is extended or adjusted under 35 U.S.C. 154(b) by 280 days.

(21) Appl. No.: 14/657,650

(22) Filed: Mar. 13, 2015

(65) Prior Publication Data

US 2015/0280529 A1    Oct. 1, 2015

(30) Foreign Application Priority Data

Mar. 25, 2014    (DE) .................. 10 2014 205 523

(51) Int. Cl.
| | |
|---|---|
| *H02K 11/00* | (2016.01) |
| *H01L 21/68* | (2006.01) |
| *H02K 5/24* | (2006.01) |
| *H02K 7/14* | (2006.01) |
| *H02K 41/02* | (2006.01) |
| *H02K 11/22* | (2016.01) |

(52) U.S. Cl.
CPC ........ *H02K 11/0026* (2013.01); *H01L 21/681* (2013.01); *H02K 5/24* (2013.01); *H02K 7/14* (2013.01); *H02K 11/22* (2016.01); *H02K 41/02* (2013.01)

(58) Field of Classification Search
CPC ...... H02K 11/0026; H02K 11/22; H02K 5/24; H02K 7/14; H02K 41/02
USPC ............................................. 310/12.06, 12.05
See application file for complete search history.

(56) References Cited

U.S. PATENT DOCUMENTS

| | | | |
|---|---|---|---|
| 7,211,908 B2 * | 5/2007 | Tamaki ................... | F16C 29/00 310/12.25 |
| 8,040,099 B2 | 10/2011 | Coleman et al. | |
| 9,081,301 B2 * | 7/2015 | Shibazaki ........... | G03F 7/70725 |

(Continued)

FOREIGN PATENT DOCUMENTS

| | | |
|---|---|---|
| DE | 10 2008 010 284 | 8/2009 |
| EP | 1 975 981 | 10/2008 |

(Continued)

OTHER PUBLICATIONS

Heidenhain Info, Electronics, vol. 1, 2009.
European Search Report, dated Feb. 26, 2015, issued in corresponding European Patent Application No. 14199710.6.

*Primary Examiner* — Michael Andrew
(74) *Attorney, Agent, or Firm* — Hunton Andrews Kurth LLP

(57) ABSTRACT

A positioning device in a gantry type of construction includes two linear guides that are arranged parallel to each other on a base and support a first cross member and a second cross member in a manner allowing movement in a first direction. A carriage having a functional element is supported on the first cross member in a manner allowing movement in a second direction. Position-measuring devices for measuring the position of the carriage relative to the second cross member are disposed on the carriage and on the second cross member.

9 Claims, 3 Drawing Sheets

(56) References Cited

U.S. PATENT DOCUMENTS

| | | |
|---|---|---|
| 2004/0178327 A1 | 9/2004 | Widdowson et al. |
| 2008/0094592 A1* | 4/2008 | Shibazaki ........... G03F 7/70725 |
| | | 310/12.06 |
| 2009/0051894 A1* | 2/2009 | Shibazaki ........... G03F 7/70725 |
| | | 310/12.06 |
| 2009/0262321 A1* | 10/2009 | Makinouchi .......... G03F 7/7085 |
| | | 355/67 |

FOREIGN PATENT DOCUMENTS

| | | | |
|---|---|---|---|
| EP | 2 066 996 | 6/2009 | |
| JP | 2007-109810 | 4/2007 | |
| WO | 02/067648 | 8/2002 | |
| WO | WO 02067648 A1 * | 8/2002 | ........... H05K 3/0008 |
| WO | WO 2009103743 A1 * | 8/2009 | ........... G01B 5/0004 |

* cited by examiner

POSITIONING DEVICE IN GANTRY TYPE OF CONSTRUCTION HAVING A POSITION-MEASUREMENT DEVICE FOR MEASURING THE POSITION OF A CARRIAGE RELATIVE TO A CROSS-MEMBER

CROSS-REFERENCE TO RELATED APPLICATIONS

The present application claims priority to Application No. 10 2014 205 523.7, filed in the Federal Republic of Germany on Mar. 25, 2014, which is expressly incorporated herein in its entirety by reference thereto.

FIELD OF THE INVENTION

The present invention relates to a positioning device in gantry type of construction, for example, having two parallel, driven, linear axes for a first direction, as well as a cross member that is displaceable along the linear axes and supports a functional element in a manner allowing displacement in a second direction, so that the functional element is able to be positioned in or parallel to a plane between the two parallel linear axes.

BACKGROUND INFORMATION

Such positioning devices are also referred to as gantry drive or X-Y gantry, and are used in many fields of technology. The processing of planar substrates, such as wafers or PC boards, is a typical application for such gantry drives. Due to advances in miniaturization, an ever better positioning accuracy is demanded here, as well.

European Patent No. 2 066 996 describes a positioning device in gantry type of construction, in which, in order to determine position more accurately, position-measuring systems are used which, in addition to the position in the actual measuring direction along a linear guide, are also able to ascertain small deviations of the position in a direction transversely thereto (for example, guiding errors). For that purpose, scales are used which, in addition to the actual measuring track in the measuring direction, also bear what is referred to a straightness track, on which such small deviations transversely to the measuring direction are able to be read. Such scales are also referred to as 1Dplus scales, because, in addition to covering one measuring direction (1D), they also permit a measurement in a further direction, albeit only small deviations in this direction. Such scales and corresponding position-measuring systems are described in greater detail in the publication HEIDENHAIN INFO, Electronics, Volume 1, 2009. A use of such scales on a positioning device in gantry type of construction is described therein, as well.

For the actual measuring direction, a typical 1Dplus scale bears an incremental track or, more generally, a measuring track, which may include fine, short lines transversely to the measuring direction that, for example, are scanned optically by a scanning head movable relative to the scale. The straightness track includes a few long lines, which are arranged parallel to the actual measuring direction (and therefore transversely to the direction of the guiding errors) next to the incremental track. This straightness track is also scanned by the scanning head. By scanning the scale tracks, periodic signals are obtained in response to a relative movement between scale and scanning head. By counting the periods and subdividing the individual periods (interpolation), the extent of the displacement and thus a position may therefore be determined. Thus, position values in two directions independent of each other are able to be read from a 1Dplus scale.

Conventional dual-gantry systems include two displaceable cross members arranged between the two linear guides in the first direction. PCT International Published Patent Application No. WO 02/067648 describes a machine tool for processing printed circuit boards, which has a second cross member having additional processing tools in order to increase productivity.

Among end uses for such positioning devices in gantry type of construction, are those in which a substrate placed on a movable table must be moved under a stationary tool. In that context, one moving direction is executed step-by-step (stepping), the other moving direction is executed with a continuous movement of the substrate (scanning). The continuous scanning movement is performed along the cross member of the positioning device, and the step-by-step stepping movement is performed along the two parallel linear axes. For many practical applications (e.g., wafer inspection with the aid of bright-field microscopy), a straight-line scanning movement with an allowed deviation of 20 nanometers at most from an ideal straight line is required.

However, such accuracies are unlikely to be achieved using conventional positioning devices in gantry type of construction. The heat input of the drive in the cross member and the forces necessary to move the wafer table cause a deformation and even vibrations of the structures of the positioning device, which make a precise position determination and therefore also a precise position control impossible.

SUMMARY

Example embodiments of the present invention provide a positioning device in gantry type of construction which permits a particularly precise detection of the position of the functional element, and thereby its precise positioning.

According to an example embodiment of the present invention, a positioning device in gantry type of construction includes two linear guides that are disposed parallel to each other on a base and support a first cross member and a second cross member in a manner allowing movement in a first direction. On the first cross member, a carriage having a functional element is supported in a manner allowing movement in a second direction. On the carriage and on the second cross member, position-measuring devices are disposed for measuring the position of the carriage relative to the second cross member.

Because the position of the carriage is measured relative to a second cross member that is influenced neither mechanically nor thermally, which is thus substantially more dimensionally stable than the first cross member bearing the carriage, a considerably more precise detection of the spatial position of the carriage is possible. With the aid of additional drives for the fine positioning, which are effective between the carriage and the functional element, a more precise positioning of the functional element is therefore possible in all degrees of freedom, regardless of a deformation of the first cross member.

Further features and aspects of example embodiments of the present invention are described below with reference to the appended Figures.

DETAILED DESCRIPTION

Figure 1:
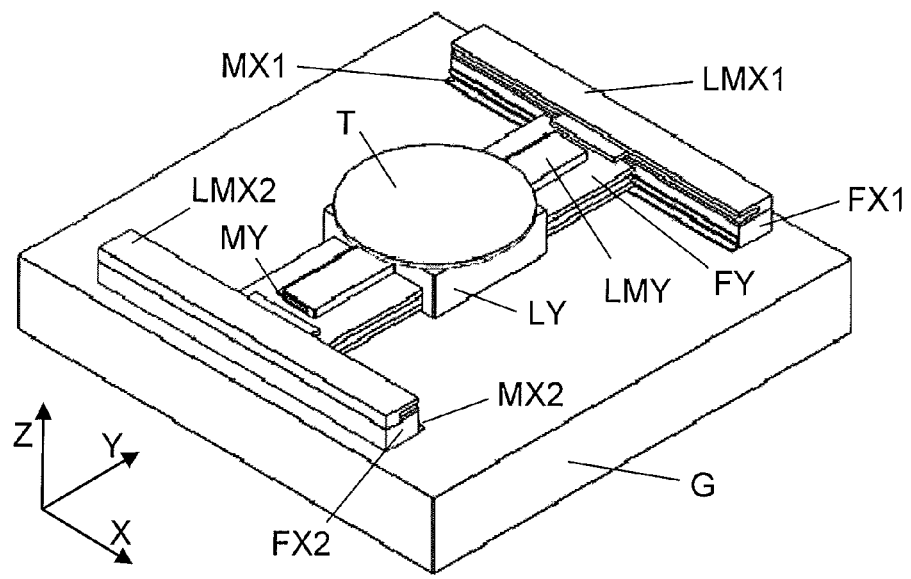
FIG. 1 illustrates a conventional positioning device in gantry type of construction.

FIG. 1 illustrates a conventional positioning device in gantry type of construction. Disposed on a base G in the form of a granite block, for example, are two parallel linear guides FX1, FX2, which support a cross member FY in a manner allowing displacement in the X-direction. To move cross member FY, two linear motors LMX1, LMX2 are used, which are arranged parallel to linear guides FX1, FX2 or are integrated into them. A carriage LY is guided on cross member FY so as to be displaceable in the Y-direction with the aid of a further linear motor LMY.

Carriage LY bears a table T as a functional element on which, for example, a wafer may be placed, which then may be processed or inspected via a tool stationery-mounted above the positioning device.

The positioning of the linear axes in the X-direction and Y-direction is accomplished with the aid of scales MX1, MX2, MY along respective guides FX1, FX2, FY, which are scanned by scanning heads, in order in each instance to ascertain the instantaneous position of all axes. All movable axes are regulated to the respective position setpoint values via, e.g., conventional position controllers, and thus table T is positioned in the X-Y plane.

Carriage LY of such a conventional positioning device usually rests on air bearings on the granite. This implies that the carriage must be movable compared to cross member FY in the following degrees of freedom: rotation about the X-direction and Y-direction as well as linear shift in the Z-direction. The evenness of the granite in that case determines the evenness of the movement of carriage LY.

Figure 2:
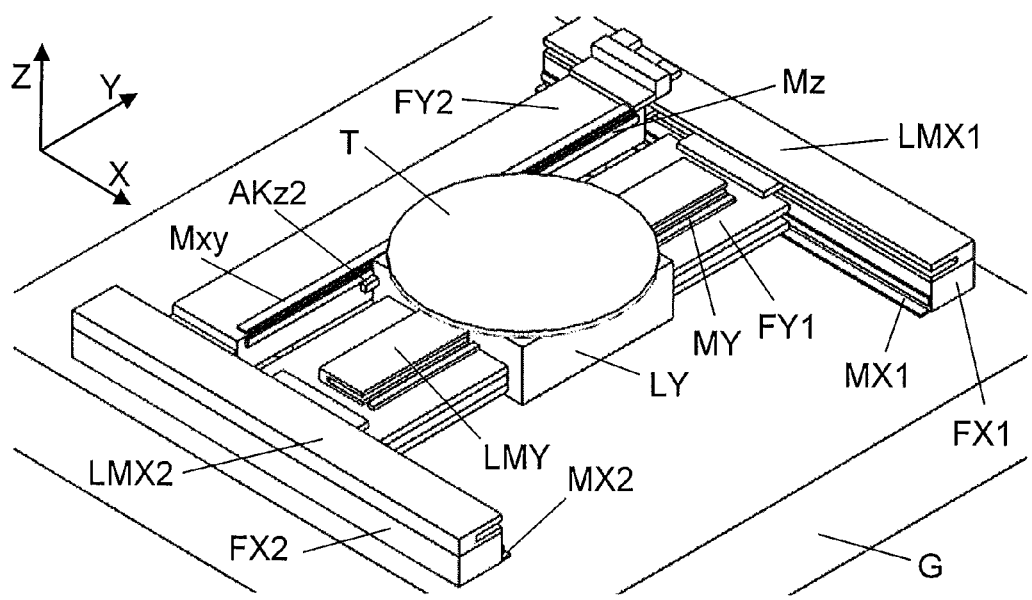
FIG. 2 illustrates a positioning device in gantry type of construction according to an example embodiment of the present invention.

FIG. 2 illustrates a positioning device in gantry type of construction according to an example embodiment of the present invention. The positioning device illustrated in FIG. 2 differs from that illustrated in FIG. 1, for example, with respect to the inclusion of second cross member FY2. In FIG. 2, the cross member bearing carriage LY is referred to as first cross member FY1. Other components corresponding to those included in FIG. 1 are not explained further.

Second cross member FY2 has its own drives for the X-direction, e.g., is able to be positioned independently of first cross member FY1. However, it is retained at a fixed distance to first cross member FY1 by its position controller. This distance must be adhered to so precisely that the position-measuring device described below may be evaluated reliably in order to determine the position of carriage LY relative to second cross member FY2. The distance tolerance of the position-measuring device, within which an evaluation is still possible, is typically at approximately 200 micrometers.

Drives are accommodated in carriage LY, which permit fine positioning of table T during the scanning movement of carriage LY. This fine positioning must be possible at least for the rotations about the X-axis and Y-axis, as well as for the Z-direction. The position correction in the X- and Y-directions, as well as the rotation about the Z-axis may also be accomplished with the drives of the positioning device in gantry type of construction. Thus, deviations from a desired scanning movement are able to be corrected in all six degrees of freedom, which, however, must be measured for this purpose.

Second cross member FY2 is used as a reference system for this position measurement, and is therefore also referred to as a movable reference system. An advantage of this arrangement is that no forces are exerted on second cross member FY2 by the scanning movements of carriage LY, and also, the drives of first cross member FY1 introduce no heat into second cross member FY2.

If one waits a certain time after each change in position (stepping movement) of first and second cross members FY1, FY2, so that vibrations of second cross member FY2 have subsided, it may be regarded as stationary. Since second cross member FY2 bears no carriage, it is able to be especially lightweight, which means its resonant frequencies are particularly high and vibrations subside quickly after a stepping movement.

If the exact position of second cross member FY2 is determined relative to base G (as further described below), it is suitable as a reference system for the position measurement of carriage LY in all degrees of freedom during the scanning movement of carriage LY, that is, of table T. Thus, if one measures the position of carriage LY directly in relation to second cross member FY2 in all degrees of freedom, deformations of first cross member FY1 (due to acceleration forces, the weight of the carriage, temperature influences, vibrations, etc.) are able to be recognized and compensated for via the available drives (the fine positioning of table T and/or the axes of the positioning device).

In order to substantially rule out every reactive effect of first cross member FY1 on second cross member FY2, vibrations of base G should be actively damped, so that not only are vibrations blocked off from the outside, but also those which are introduced into base G by the process forces of first cross member FY1 and second cross member FY2.

To determine the position of carriage LY relative to second cross member FY2, scales Mxy, Mz are provided on the second cross member, and a scanning head AKz2 is provided on the carriage. Further scales and scanning heads are not illustrated in FIG. 2. However, one possibility for their placement is clarified more precisely in the following Figures.

Figure 3:
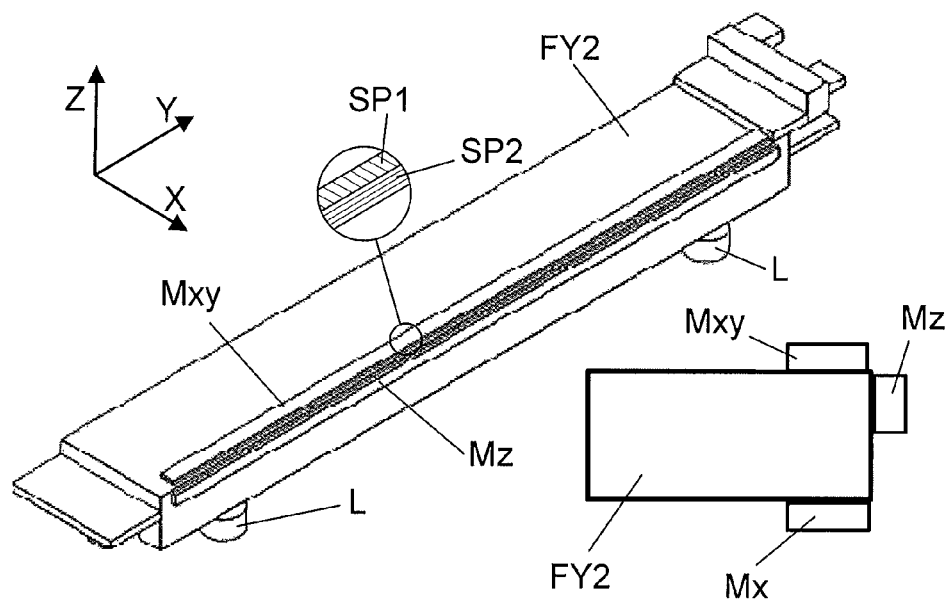
FIG. 3 illustrates a second cross member, used as a reference system, of the positioning device.

In FIG. 3, second cross member FY2 is illustrated, together with a schematic cross-sectional view through the X-Z plane. Second cross member FY2 is supported in the Z-direction on three aerostatic air bearings L, preloaded by vacuum, upon the granite, and in the Y-direction via a further air bearing against a vertical surface of the granite along first linear guide FX1. This fourth air bearing for the Y-direction is also preloaded by vacuum. The total of four air bearings L block four degrees of freedom of second cross member FY2. It is thus an isostatic bearing assembly, by which an introduction of force in response to the movement of cross member FY2 on the not perfectly even granite is avoided. The two remaining degrees of freedom (X and rotation about Z) of second cross member FY2 are controlled by its drives along linear guides FX1, FX2. Due to the preloading of all air bearings L by vacuum, all antagonistic forces within air bearings L are equalized. No forces are introduced by them into second cross member FY2.

Three scales Mxy, Mz and Mx are disposed on second cross member FY2. Located on the upper side of cross member FY2 facing away from base G is what is referred to as a 1Dplus scale Mxy having incremental graduations in the X-direction and Y-direction, e.g., in the two directions parallel to base G. In the enlarged segment, a measuring track SP1 and a straightness track SP2 are illustrated. On the face of second cross member FY2 facing first cross member FY1, a scale Mz is disposed, which has an incremental graduation in the Z-direction. It may be a further 1Dplus scale whose straightness track in that case is the incremental graduation in the Z-direction, for the graduation lines extend transversely to the Z-direction in the Y-direction. The actual measuring track of this scale Mz in the Y-direction is not scanned in the exemplary embodiment illustrated. On the lower side of cross member FY2 facing base G, a third scale Mx is located, which bears an incremental graduation in the X-direction. For this, a 1Dplus scale may also be used, whose actual measuring track in the Y-direction is not needed.

As described above, scales Mxy, Mz and Mx on second cross member FY2 are used to detect the position of carriage LY relative to second cross member FY2, and specifically, in all six degrees of freedom. The scanning heads for the scanning of scales Mxy, Mz and Mx are therefore mounted on carriage LY.

Figure 4:
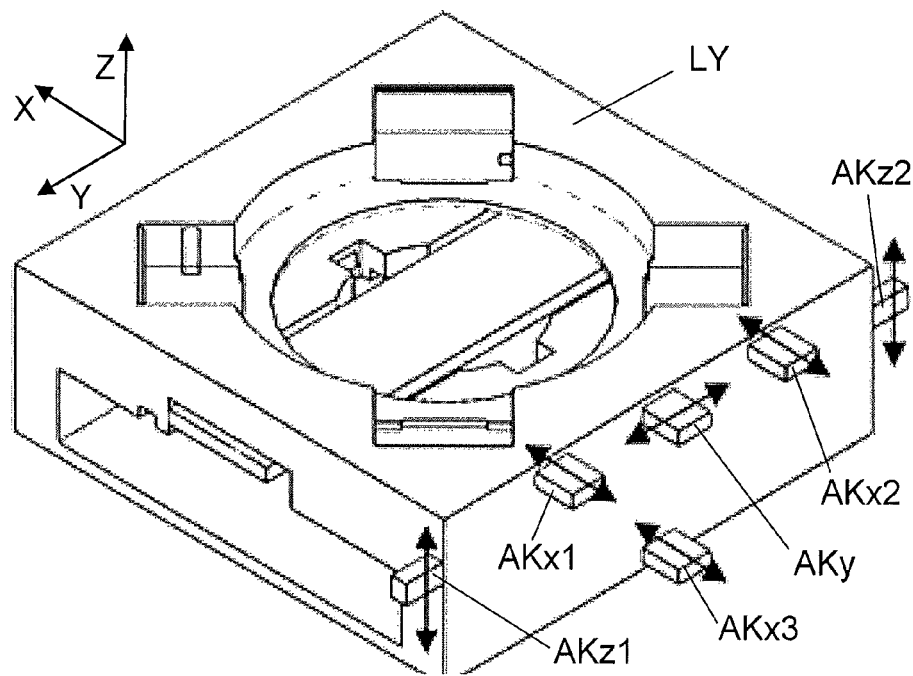
FIG. 4 illustrates a carriage of the positioning device.

FIG. 4 illustrates carriage LY, and to be more precise, rotated by 180 degrees about the Z-axis in comparison to FIG. 2, in order to be able to recognize all scanning heads needed for the scanning of scales Mxy, Mz, Mx:

- The rotation of carriage LY about the Z-axis may be calculated from the difference in the X-positions, which are read from scale Mxy by scanning heads AKx1 and AKx2. In this instance, scanning heads AKx1 and AKx2 read the straightness track of scale Mxy, the straightness track including a few long lines in the Y-direction.
- The rotation of carriage LY about the Y-axis may be calculated from a combination of the X-positions, which are read from scale Mxy and scale Mx, respectively, by scanning heads AKx1, AKx2 and AKx3. In this instance, scanning heads AKx1, AKx2 and AKx3 read the straightness tracks of scales Mxy and Mx, each of which includes a few long lines in the Y-direction.
- The rotation of carriage LY about the X-axis may be calculated from the difference in the Z-positions, which are read from scale Mz by scanning heads AKz1 and AKz2. In this instance, scanning heads AKz1 and AKz2 read the straightness track of scale Mz, the straightness track including a few long lines in the Y-direction.
- The position of carriage LY in the X-direction is obtained from the average value of the X-positions ascertained with the aid of scanning heads AKx1 and AKx2.
- The position of carriage LY in the Z-direction is obtained from the average value of the Z-positions ascertained with the aid of scanning heads AKz1 and AKz2.
- The position of carriage LY in the Y-direction is obtained from the Y-position ascertained with the aid of scanning head AKy, in so doing a previously determined rotation about the Z-axis must be taken into account.

Using the described layout of 1Dplus scales Mxy, Mz, Mx on second cross member FY2 and the placement of scanning heads AKy, AKx1, AKx2, AKx3, AKz1, AKz2 on carriage LY, it is possible to determine the position of carriage LY relative to second cross member FY2 in all degrees of freedom. At the same time, other arrangements and combinations of scales and scanning heads are possible, so long as they likewise permit only the complete determination of all six degrees of freedom. As example for another arrangement of the scanning heads, only the ascertainment of the position in the Y-direction is described, which may be obtained by scanning the actual measuring track of any of the three 1Dplus scales Mxy, Mz, Mx. It may be provided that at least one of the three scales Mxy, Mz, Mx is in the form of a 1Dplus scale, since measured position values may be scanned in two different directions from such a scale, as in the present example of scale Mxy.

If the spatial position of carriage LY is known and if it is regarded as a rigid body, then the spatial position of any point of carriage LY (thus, for example, the tool center point of a tool joined to the carriage or the middle of a wafer table) may be ascertained by geometric transformations.

In order for scanning heads AKy, AKx1, AKx2, AKx3, AKz1, AKz2 to be able to read scales Mxy, Mz, Mx at any time, the distance between the two cross members FY1 and FY2 must be set and adhered to so precisely that a correct evaluation of the signals of the scanning heads is possible at all times, in keeping with the distance tolerance of approximately 200 micrometers mentioned above.

The position detection between carriage LY and second cross member FY2 is carried out contactlessly, e.g., by the scanning of scales Mxy, Mz, Mx using light. Therefore, no force acts on second cross member FY2 which also, other than that, due to its air bearing system, rests on a granite (base G) that is vibration-isolated as much as possible. In contrast to first cross member FY1, during a scanning movement in the Y-direction, second cross member FY2 is subject to no process forces or thermal influences whatsoever which could deform it. Thus, if by an external calibration, one knows the form of the second cross member as precisely as possible, and if one determines its position within an absolute reference system (which may be given by base G, for example), then the position of carriage LY may also be ascertained relative to this absolute reference system.

During a scanning movement along first cross member FY1, it is possible to determine all deviations of the spatial position of carriage LY, and therefore to correct the spatial position of functional element T via drives for the fine positioning of functional element T or via the drives in linear guides FX1, FX2 and FY1. The drives for the fine positioning fit in the cut-outs to be discerned on the upper side of carriage LY.

Since the position of carriage LY is measured in all degrees of freedom, and the spatial position of functional element T is actively corrected accordingly, an air bearing system of carriage LY on the base is no longer absolutely necessary, but is possible. Without an air bearing system, carriage LY may be joined firmly to first cross member FY1, with mobility in the Y-direction as the only degree of freedom. In contrast to conventional systems, it is not necessary to use an especially even and therefore correspondingly costly granite as base G.

If the absolute reference system is provided by base G, then the position of second cross member FY2 (which serves as movable reference system) relative to this absolute reference system may be ascertained by a suitable position-measuring system.

Figure 5:
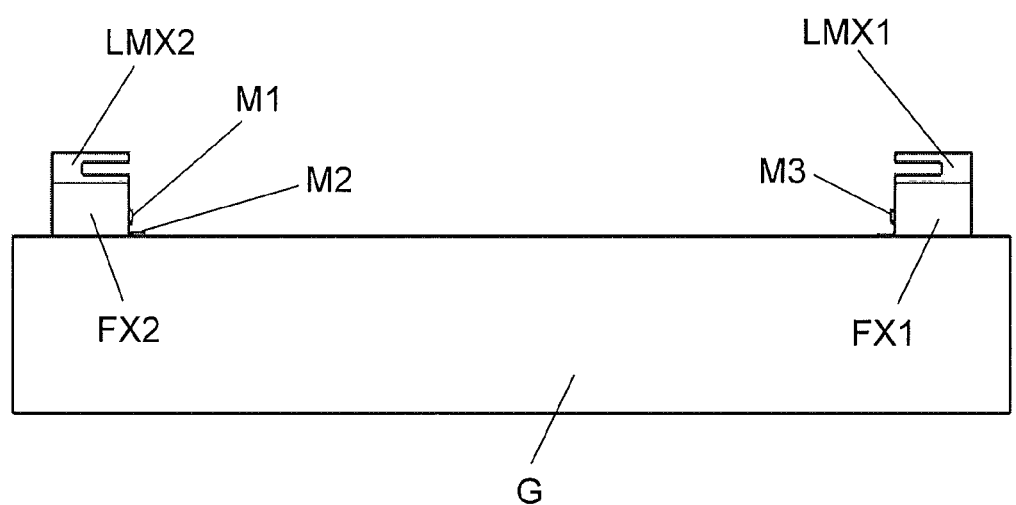
FIG. 5 illustrates the base of the positioning device, having scales for determining the position of the second cross member, used as a reference system, relative to the base.

FIG. 5 illustrates how such a position-measuring system for the position of second cross member FY2 relative to base G may be constructed. Three 1Dplus scales M1, M2, M3 are disposed on or joined firmly to base G, so that their graduation tracks cover different directions X, Y, Z. These graduation tracks are read by a plurality of scanning heads disposed on second cross member FY2, and the position values thus ascertained are utilized to calculate the spatial position of second cross member FY2 relative to the base, in doing so, all six degrees of freedom are again to be taken into account. Since there are also many possibilities here for placing scanning heads in a suitable manner on second cross member FY2, a depiction of a specific placement is omitted.

Alternatively, the three scales M1, M2, M3 may also be mounted on any other structure intended to be regarded as an absolute reference system for the positioning of functional element T. Thus, very sensitive optical assemblies for processing or inspecting wafers are often disposed on a platform which is not joined to the base of an assigned positioning device in order to avoid deformation of the optical system by a vibrating granite base. Displacements in the range of a few micrometers may thereby occur between the granite and the platform. In such cases, it is better to use this platform as an absolute reference system.

Figure 6:
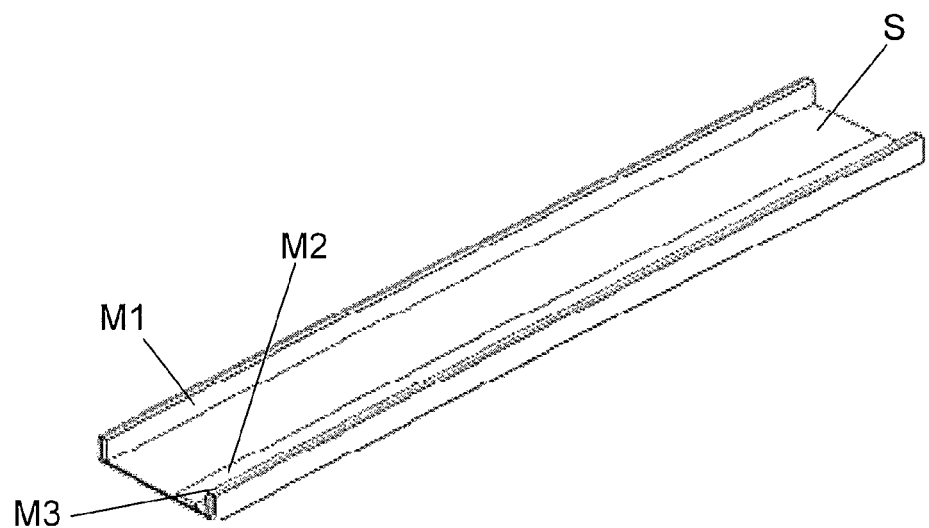
FIG. 6 illustrates a rail having scales for determining the position of the second cross member, used as a reference system, relative to the rail.

Thus, FIG. 6 shows a rail S having a U-profile, in which again three 1Dplus scales M1, M2, M3 are mounted for scanning by scanning heads situated on second cross member FY2. For example, this dimensionally stable rail, produced with very small tolerances, may be bolted to the side of the optical platform, which is disposed above the positioning device, and relative to which, functional element T is intended to be positioned. In this context, the scanning heads for the scanning of scales M1, M2, M3 must be mounted on second cross member FY2 such that they are able to supply position values in any X-position of second cross member FY2.

Thus, if one knows precisely the form of second cross member FY2 and its position relative to the absolute reference system, by measuring the spatial position of carriage LY relative to second cross member FY2, it is possible to infer the spatial position of carriage LY relative to the absolute reference system. Consequently, a scanning movement of table T on a scanning line predefined in the absolute reference system may be performed very accurately, regardless of a deformation of first cross member FY1, on which carriage LY is guided. The negative effects of the driving forces and their heat input, and the deformation of first cross member FY1 associated with them, are eliminated by measuring the resultant incorrect positioning of carriage LY in all degrees of freedom and correcting it for table T. A wafer placed on table T is therefore able to adhere very precisely to the required scanning movement, and at the same time, maintain its orientation in all remaining degrees of freedom.

The following steps thus permit a very precise scanning movement of table T:
a) If second cross member FY2 used as a movable reference system is not sufficiently straight, its form is ascertained by an external calibration and the result is stored for later consideration.
b) First and second cross members FY1, FY2 are shifted in parallel for each stepping movement. There is then a wait until vibrations of second cross member FY2 have subsided.
c) The position of second cross member FY2 is determined relative to the absolute reference system, for in the final analysis, the intention is for table T to carry out a scanning movement within this absolute reference system, under the most accurate check possible of its six degrees of freedom.
d) During the scanning movement of carriage LY, the spatial position of carriage LY is ascertained relative to second cross member FY2 in all six degrees of freedom. To that end, positions are read from scales Mxy, Mz, Mx, mounted on second cross member FY2, by scanning heads AKy, AKx1, AKx2, AKx3, AKz1, AKz2 mounted on carriage LY. In this manner, the position of carriage LY relative to second cross member FY2 (which is used as movable reference system) is determined in all degrees of freedom. Since the position (and possibly from step a) also the exact form) of second cross member FY2 relative to the absolute reference system is known, the position of carriage LY relative to the absolute reference system may be ascertained in all six degrees of freedom.
e) For the functional element, e.g., for table T, above all, position deviations of carriage LY based on a deformation of first cross member FY1 are able to be corrected using the drives for the fine positioning or using the drives of the positioning device in gantry type of construction. The functional element may thus be positioned very precisely relative to the absolute reference system.

What is claimed is:

1. A positioning device in a gantry type of construction, comprising:
   a base;
   a first cross member;
   a second cross member;
   two linear guides arranged parallel to each other on the base and supporting the first cross member and the second cross member in a manner allowing movement in a first direction;
   a carriage having a functional element supported on the first cross member in a manner allowing movement in a second direction; and
   a position-measurement device adapted to detect a position of the carriage relative to the second cross member, the position-measurement device disposed on the carriage and on the second cross member, and including a plurality of scales provided on the second cross member, and scanning heads provided on the carriage and adapted to scan the scales.

2. The positioning device according to claim 1, wherein the position-measurement device is adapted to determine a spatial position of the carriage relative to the second cross member in all six degrees of freedom.

3. The positioning device according to claim 1, wherein at least one of the scales on the second cross member includes a 1Dplus scale having a measuring track and a straightness track, scanning heads of the carriage being aligned with the measuring track and the straightness track to read position values in two directions that are linearly independent of each other.

4. The positioning device according to claim 1, wherein the base is actively vibrationally-damped.

5. The positioning device according to claim 1, further comprising a position-measurement system adapted to detect a position of the second cross member relative to an absolute reference system, so that the second cross member is used as a movable reference system to determine a spatial position of the carriage relative to the absolute reference system.

6. The positioning device according to claim 5, wherein the position-measurement system includes at least one 1Dplus scale having a measuring track and a straightness track.

7. The positioning device according to claim 1, further comprising fine-positioning drives between the carriage and the functional element adapted to permit a correction of a spatial position of the functional element at least in the following degrees of freedom: linear shift in a direction perpendicular to the first and second directions, rotation about the first direction, and rotation about the second direction.

8. The positioning device according to claim 7, wherein the drives are controllable to adjust for incorrect positions of the carriage.

9. The positioning device according to claim 1, wherein the functional element includes a table adapted to carry a wafer for processing and/or inspection by a tool mounted above the positioning device.

* * * * *